(12) United States Patent
Slaton et al.

(10) Patent No.: US 8,482,929 B2
(45) Date of Patent: Jul. 9, 2013

(54) SYSTEMS FOR CIRCUIT BOARD HEAT TRANSFER AND METHOD OF ASSEMBLING SAME

(75) Inventors: David S. Slaton, Huntsville, AL (US); David McDonald, Huntsville, AL (US); Jerry L. Wright, Huntsville, AL (US)

(73) Assignee: General Electric Company, Schenectady, NY (US)

( * ) Notice: Subject to any disclaimer, the term of this patent is extended or adjusted under 35 U.S.C. 154(b) by 41 days.

(21) Appl. No.: 13/109,253

(22) Filed: May 17, 2011

(65) Prior Publication Data

US 2012/0293963 A1 Nov. 22, 2012

(51) Int. Cl.
*H05K 7/20* (2006.01)

(52) U.S. Cl.
USPC ...... 361/759; 361/679.54; 361/761; 174/252; 174/548; 174/562

(58) Field of Classification Search
USPC ............... 361/679.54, 688, 701–704, 707, 361/709–722, 724–733, 740–741, 747, 752, 361/759–761
See application file for complete search history.

(56) References Cited

U.S. PATENT DOCUMENTS

| | | | | |
|---|---|---|---|---|
| 4,867,235 A | * | 9/1989 | Grapes et al. | 165/185 |
| 5,280,411 A | | 1/1994 | Dirks et al. | |
| 5,923,084 A | | 7/1999 | Inoue | |
| 6,156,980 A | * | 12/2000 | Peugh et al. | 174/252 |
| 6,212,071 B1 | * | 4/2001 | Roessler et al. | 361/704 |
| 6,448,509 B1 | | 9/2002 | Huemoeller | |
| 6,657,864 B1 | * | 12/2003 | Dyckman et al. | 361/704 |
| 6,765,798 B1 | * | 7/2004 | Ratliff et al. | 361/704 |
| 7,349,221 B2 | * | 3/2008 | Yurko | 361/719 |
| 7,787,249 B2 | * | 8/2010 | Sundstrom | 361/714 |
| 7,974,099 B2 | * | 7/2011 | Grajcar | 361/720 |
| 8,223,497 B2 | * | 7/2012 | Sundstrom et al. | 361/707 |
| 2002/0054480 A1 | * | 5/2002 | Jitaru | 361/704 |
| 2003/0184969 A1 | | 10/2003 | Itabashi | |
| 2010/0195287 A1 | | 8/2010 | Sundstrom | |
| 2010/0254093 A1 | | 10/2010 | Oota | |

FOREIGN PATENT DOCUMENTS

| | | |
|---|---|---|
| DE | 102008015785 A1 | 5/2009 |
| EP | 2114113 A1 | 11/2009 |

OTHER PUBLICATIONS

Banton et al., A VITA-Based Framework for Ruggedized COTS Electronics with Emphasis on Liquid Cooling—VITA 48 (REDI); Mercury Computer Systems, Inc.; 2006; pp. 00-10; Chelmsford, MA.

Yung et al., Using Metal Core Printed Circuit Board (MCPCB) as a Solution for Thermal Management; Technical Paper; The Hong Kong Polytechnic University; pp. 12-16; Journal of the HKPCA/Issue No. 24/2007/Q2; Hong Kong.

EP Search Report issued in connection with corresponding EP Patent Application No. 12167705.8 dated on Aug. 27, 2012.

* cited by examiner

*Primary Examiner* — Courtney Smith
(74) *Attorney, Agent, or Firm* — Global Patent Operation; Mark A. Conklin

(57) ABSTRACT

A printed circuit board assembly is provided. The assembly includes a chassis, a heatframe coupled to the chassis, a printed circuit board (PCB), a thermal interface material (TIM) coupled between the PCB and the heatframe, and at least one thermal via extending through the PCB and coupled to the TIM, wherein the assembly is configured to transfer heat from the PCB to the chassis through the TIM and the at least one thermal via.

10 Claims, 4 Drawing Sheets

SYSTEMS FOR CIRCUIT BOARD HEAT TRANSFER AND METHOD OF ASSEMBLING SAME

BACKGROUND OF THE INVENTION

The subject matter described herein relates generally to improving heat transfer for a printed circuit board (PCB) assembly, and, more particularly, to a thermal interface material and thermal via for reducing thermal resistance between a PCB and a chassis.

Components designed to remove heat from a PCB to a chassis by way of thermal conduction, such as those assemblies containing high power devices, are increasingly challenged to remove higher levels of heat. This is because newly developed processing devices typically contain more circuitry and therefore tend to generate higher heat loads, and/or because components are smaller, thus permitting a PCB to contain more components, thereby increasing an amount of heat generated by the PCB.

In at least some known PCB assemblies, components designed to remove heat contact a non-conductive substrate on the PCB. To avoid conducting electricity between an electrically grounded chassis and electrical components on the PCB (e.g., circuit planes and/or circuit components), at least some known PCB assemblies do not include heat removal components that directly contact the circuit planes and/or circuit components directly. However, the circuit planes and/or circuit components are generally a primary source of heat on the PCB. If a sufficient amount of the heat generated by circuit planes and/or circuit components is not removed and/or dissipated from the PCB, the PCB and circuit components may be damaged and/or malfunction.

BRIEF DESCRIPTION OF THE INVENTION

In one aspect, a printed circuit board assembly is provided. The assembly includes a chassis, a heatframe coupled to the chassis, a printed circuit board (PCB), a thermal interface material (TIM) coupled between the PCB and the heatframe, and at least one thermal via extending through the PCB and coupled to the TIM, wherein the assembly is configured to transfer heat from the PCB to the chassis through the TIM and the at least one thermal via.

In another aspect, a heat removal system is provided. The heat removal system includes a printed circuit board (PCB), at least one thermal via extending through the PCB, and a thermal interface material (TIM) coupled to the at least one thermal via such that heat is removed from the PCB through the at least one thermal via and the TIM.

In yet another aspect, a method of assembling a printed circuit board assembly is provided. The method includes providing a printed circuit board (PCB), positioning at least one thermal via within the PCB, coupling a thermal interface material (TIM) to the at least one thermal via, coupling the TIM to a heatframe, and coupling the heatframe to a chassis such that heat is transferred from the PCB to the chassis through the at least one thermal via and the TIM.

DETAILED DESCRIPTION OF THE INVENTION

The embodiments described herein facilitate removing heat generated on a printed circuit board (PCB). A thermal interface material (TIM) composed of a thermally conductive and electrically insulated material couples a heatframe to the PCB. The PCB includes at least one thermal via coupled to the TIM. Heat generated on the PCB is removed through the thermal via, the TIM, and the heatframe. Since the TIM is electrically insulated, circuit ground planes on the PCB may be tied directly to the thermal via, improving the quantity and/or rate of heat removed from the PCB. Finally, because thermal vias may be tied directly to circuit ground planes, the systems described herein have a lower thermal resistivity as compared to known PCB assemblies, and accordingly, increased heat transfer properties.

Figure 1:
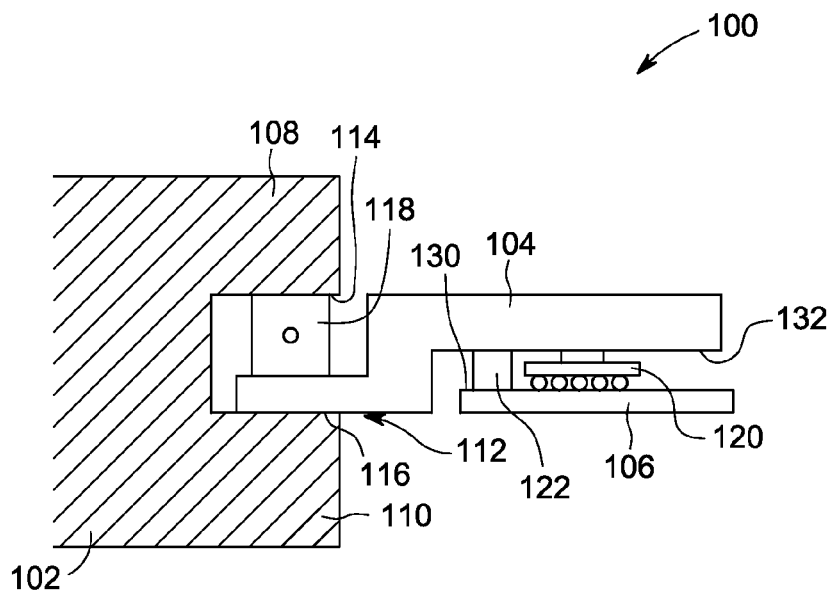
FIG. 1 is a schematic diagram of an exemplary printed circuit board assembly.

FIG. 1 is a schematic diagram of a printed circuit board (PCB) assembly 100. Assembly 100 includes a chassis 102, a heatframe 104, and a PCB 106. Chassis 102 includes cold walls 108 and 110 that form a slot 112 extending along a length of cold walls 108 and 110. Cold wall 108 has a lower surface 114 and cold wall 110 has an upper surface 116. A board retainer, or any other suitable fixing mechanism, such as a wedgelock 118, is coupled between one or both of cold walls 108 and 110 and heatframe 104. In the exemplary embodiment, wedgelock 118 is coupled between and abuts lower surface 114 and heatframe 104. Cold walls 108 and 110 are kept at a constant temperature, such that chassis 102 operates as a heat sink, as described in detail below.

In the exemplary embodiment, wedgelock 118 is a mechanical fastener designed to secure heatframe 104 in slot 112 by expanding and applying contact pressure between heatframe 104 and lower surface 114 of slot 112, via a plurality of individual wedges (not shown). In one embodiment, wedgelock 118 mechanically secures heatframe 104 in slot 112 by expanding the plurality of wedges using an expansion screw (not shown) and causing pressure to be applied to both heatframe 104 and lower surface 114 of slot 112. This pressure caused by wedgelock 118 forces heatframe 104 against upper surface 116 and cold wall 110 to facilitate removing heat from PCB 106, as described in detail below. Alternatively, wedgelock 118 may be any mechanical fastener that facilitates securing heatframe 104 within slot 112.

In the exemplary embodiment, heatframe 104 is fabricated from a thermally conductive metal, for example, aluminum or copper. Alternatively, heatframe 104 is fabricated from any material that enables PCB assembly 100 to function as described herein. Heatframe 104 is coupled to PCB 106 via a mounting device 120. Mounting device 120 may include, for example, a ball grid array (BGA), a pin grid array (PGA), and/or a land grid array (LGA). A thermal interface material (TIM) 122 is also coupled between heatframe 104 and PCB 106, as described in detail below. In the exemplary embodiment TIM 122 maintains a separation between heatframe 104 and PCB 106 such that heatframe 104 does not directly contact PCB 106. Alternatively, heatframe 104 may directly contact at least a portion of PCB 106 to facilitate removing heat from PCB 106.

In the exemplary embodiment, TIM 122 is coupled to an upper surface 130 of PCB 106 and a lower surface 132 of heatframe 104. Alternatively, TIM 122 may be coupled between PCB 106 and heatframe 104 at any location and/or position that enables assembly 100 to function as described herein. Further, in some embodiments, TIM 122 may be coupled between PCB 106 and chassis 102, such that heat removed from PCB 106 does not pass through a heatframe 104.

Figure 2:
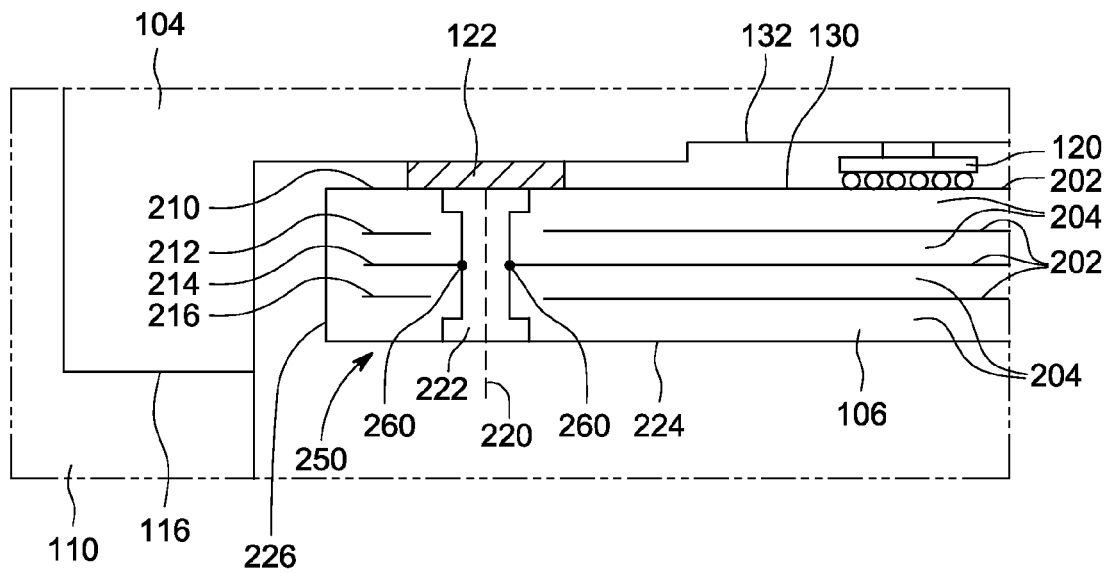
FIG. 2 is a cross-sectional view of a portion of the printed circuit board assembly shown in FIG. 1.

FIG. 2 is a cross-sectional view of a portion of PCB assembly 100 shown in FIG. 1. TIM 122 is composed of a thermally conductive but electrically insulated material such that TIM 122 conducts thermal energy (i.e., heat), but does not conduct electricity. To efficiently remove heat from PCB 106, TIM 122 is composed of a material with a low thermal resistance. In one embodiment, TIM 122 has a thermal resistance, θ, of 3.6 degrees Kelvin per Watt (K/W). Alternatively, TIM 122 may be composed of any material that enables PCB assembly 100 to function as described herein. For example, TIM 122 may be a silicon-based material infused with aluminum oxide, zinc oxide, boron nitride and/or silver.

PCB 106 includes a plurality of copper circuit planes 202 positioned between layers of a PCB substrate 204. PCB substrate 204 is composed of a dielectric material, for example, a fiberglass sheet impregnated with a polyamide resin and/or an epoxy resin. Alternatively, PCB substrate 204 is composed of any material that enables PCB assembly 100 to function as described herein.

In the exemplary embodiment, circuit planes 202 on PCB 106 include a first circuit plane 210, a second circuit plane 212, a third circuit plane 214, and a fourth circuit plane 216. Circuit planes 202 are positioned in a stacked and/or overlapping orientation on PCB 106. In the exemplary embodiment, first circuit plane 210 is located on upper surface 130 of PCB 106. First, second, third, and fourth circuit planes 210, 212, 214, and 216 may each include a circuit ground plane (i.e., a circuit plane having ground potential) or a circuit power plane (i.e., a circuit plane having a non-zero potential). While four circuit planes 202 are shown in the exemplary embodiment, PCB 106 may include any number of circuit planes 202 that enable PCB assembly 100 to function as described herein.

In the exemplary embodiment, at least one aperture 220 extends through PCB 106. Aperture 220 extends through PCB substrate 204, first circuit plane 210, second circuit plane 212, third circuit plane 214, and fourth circuit plane 216. In the exemplary embodiment, aperture 220 is substantially cylindrical and extends through PCB 106 in a direction substantially perpendicular to upper surface 130. Alternatively, aperture 220 may have any suitable shape and/or orientation that enables PCB assembly 100 to function as described herein. For example, in some embodiments, aperture 220 may be oriented obliquely or parallel with respect to upper surface 130.

A thermal via 222 extends through aperture 220. In the exemplary embodiment, thermal via 222 extends from upper surface 130 to a lower surface 224 of PCB 106. Alternatively, thermal via 222 may extend through only a portion of PCB 106. Further, in some embodiments, instead of extending through aperture 220, thermal via 222 extends along an edge 226 of PCB 106.

Thermal via 222 is coupled to TIM 122. TIM 122, thermal via 222, and PCB 106 form a heat removal system 250. To facilitate transferring heat from PCB 106 to chassis 102, at least one circuit plane 202 is tied to thermal via 222, such that heat generated by circuit plane 202 is conducted through heat removal system 250. As used herein, tying circuit plane 202 to thermal via 222 means electrically and/or mechanically coupling circuit plane 202 to thermal via 222 such that heat may be transferred from circuit plane 202 to thermal via 222. For example, in some embodiments, aperture 220 includes plating that contacts circuit planes 202, and thermal via 222 is coupled to circuit planes 202 through the plating. Alternatively, circuit plane 202 may be tied to thermal via 222 by electrical leads. Further, in some embodiments, thermal via 222 may abut circuit plane 202. In the exemplary embodiment, third circuit plane 214 is tied to thermal via 222 at contact points 260. Alternatively, any of first, second, third, and fourth circuit planes 210, 212, 214, and 216 may be tied to thermal via 222 by any means that enable PCB assembly 100 to function as described herein. Thermal energy may also flow into thermal via 222 from PCB substrate 204 surrounding thermal via 222.

To facilitate removing heat from PCB 106, thermal via 222 is composed of a thermally conductive material. Because of TIM 122, thermal via 222 is electrically isolated from heatframe 104 and chassis 102. Thus, circuit planes 202 tied to thermal via 222 are also electrically isolated from heatframe 104 and chassis 102. Accordingly, in the exemplary embodiment, thermal via 222 is composed of an electrically conductive material, such as, for example, copper. Alternatively, thermal via 222 may be composed of any material that enables PCB assembly 100 to function as described herein.

As described above, circuit planes 202 may include circuit ground planes and/or circuit power planes. Accordingly, thermal via 222 may be tied to at least one circuit ground plane or at least one circuit power plane. Further, while only one thermal via 222 is shown in FIG. 2, in some embodiments, PCB 106 includes an array of thermal vias 222 that each may be coupled to TIM 122. In some embodiments, a first thermal via is tied to circuit ground planes on PCB 106, and a second thermal via is tied to circuit power planes on PCB 106.

In operation, PCB 106 and/or circuit planes 202 generate heat. More specifically, power-carrying circuitry coupled to and/or located on circuit planes 202 generate heat. To facilitate removing heat from PCB 106, first cold wall 108, second cold wall 110, and/or chassis 102 are kept at a constant temperature cooler than a temperature of PCB 106, such that heat generated on PCB 106 flows to chassis 102. More specifically, referring to the embodiment shown in FIG. 2, heat generated at third circuit plane 214 flows into thermal via 222 through contact points 260. From thermal via 222, heat flows through TIM 122 into heatframe 104. Further, as cold walls 108 and 110 are kept at a constant temperature cooler than that of PCB 106, and wedgelock 118 presses heatframe 104 against cold wall 110, heat flows through heatframe 104 into chassis 102. Thus, thermal via 222, TIM 122, and heatframe 104 provide a direct thermal path from circuit planes 202 to chassis 102. As TIM 122 is electrically insulated, however, electricity is not conducted from circuit planes 202 to chassis 102. Accordingly, TIM 122 and thermal via 222 remove heat directly from circuit plane 202 on PCB 106 while maintaining electrical isolation between circuit plane 202 and chassis 102.

Figure 3:
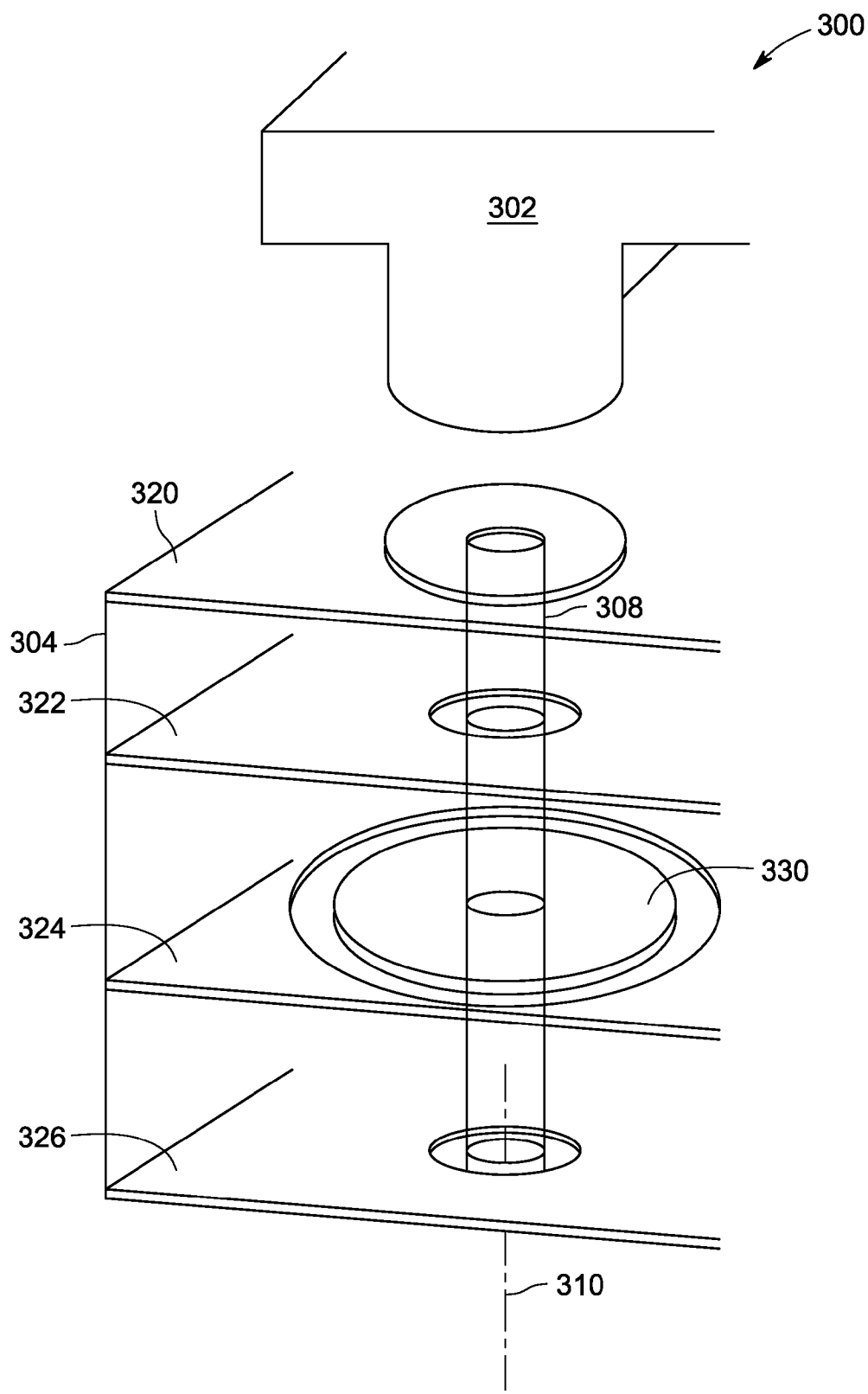
FIG. 3 is an exploded view of an exemplary cooling structure that may be used with the printed circuit board assembly shown in FIG. 1.
Figure 4:
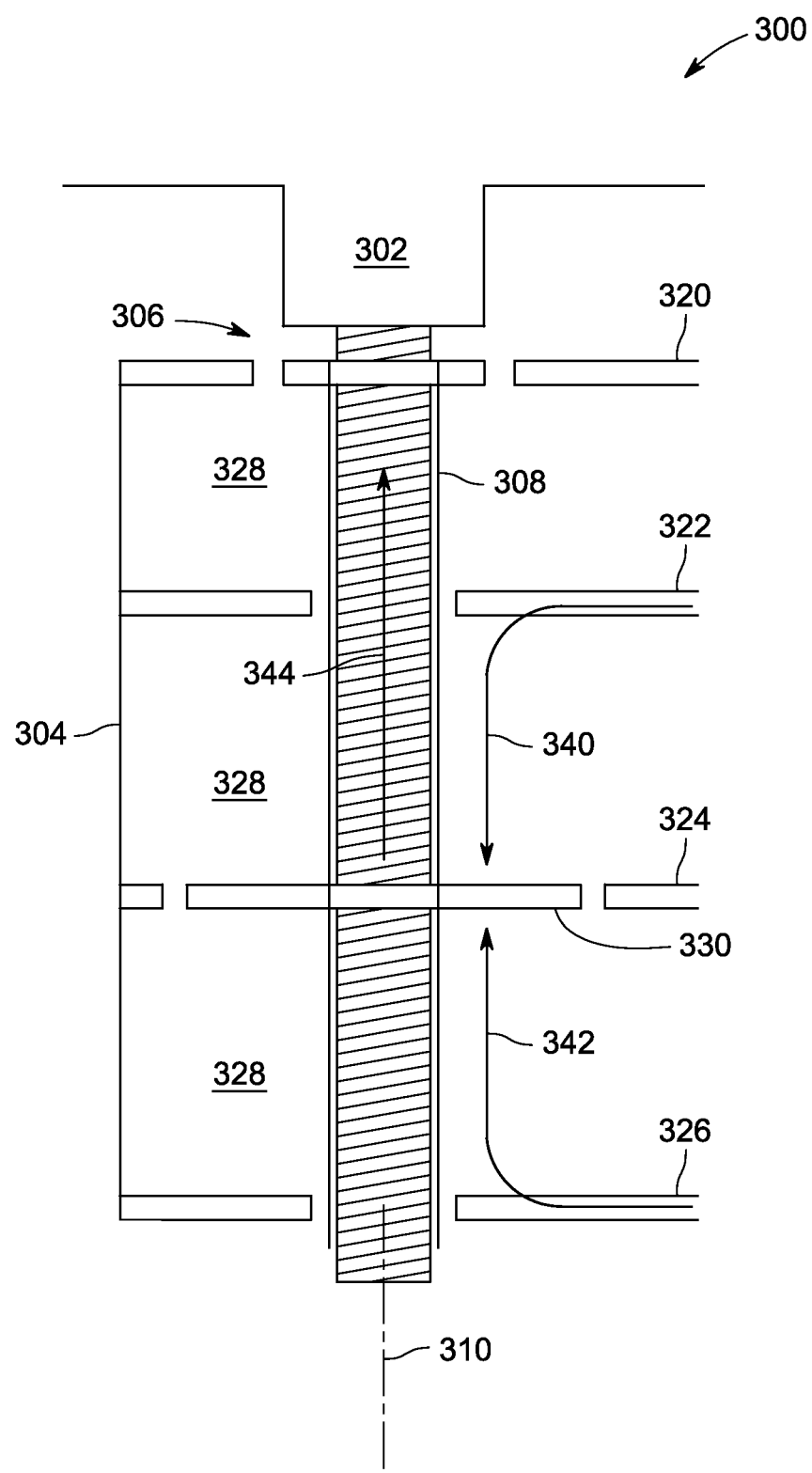
FIG. 4 is a cross-sectional view of the cooling structure shown in FIG. 3.

FIG. 3 is an exploded view of an exemplary cooling structure 300 that may be used with the PCB assembly 100 shown in FIG. 1. FIG. 4 is a cross-sectional view of cooling structure 300 shown in FIG. 3. In the embodiment shown in FIGS. 3 and 4, a heatframe 302 is mounted to a PCB 304 at a mounting point 306. While only one mounting point 306 is shown in FIGS. 3 and 4, heatframe 302 may be mounted to PCB 304 at any number of mounting points 306 that enable cooling structure 300 to function as described herein.

Heatframe 302 is mounted to PCB 304 by a mounting component 308, such as, for example, a mounting screw. Mounting component 308 extends through an aperture 310 in PCB 304. In the exemplary embodiment, aperture 310 extends through a surface layer 320, a first plane layer 322, a route layer 324, and a second plane layer 326 on PCB 304. First plane layer 322, route layer 324, and second plane layer 326 are separated by a PCB substrate 328. First and second plane layers 322 and 326 contain power-carrying circuitry, while at least a portion of route layer 324 does not include power-carrying circuitry. Alternatively, PCB 304 may include any number and/or arrangement of layers that enables cooling structure 300 to function as described herein.

In the exemplary embodiment, a cooling plate 330 is coupled to mounting component 308 at route layer 324. Cooling plate 330 is substantially co-planar with route layer 324. Further, while cooling plate 330 has a substantially annular shape in the exemplary embodiment, cooling plate 330 may alternatively have any suitable shape, such as square, rectangular, and/or polygonal. As described above, at least a portion of route layer 324 does not include power-carrying circuitry. Accordingly, cooling plate 330 is electrically isolated from power-carrying circuitry on PCB 304. More specifically, cooling plate 330 is electrically isolated from first and second plane layers 322 and 326 by PCB substrate 328.

In the exemplary embodiment, cooling plate 330 is shaped and oriented to overlap at least a portion of first and second plane layers 322 and 326. Accordingly, when heat is generated on first plane layer 322 and/or second plane layer 326, the generated heat flows from first plane layer 322 and/or second plane layer 326 to cooling plate 330 through PCB substrate 328 along heat transfer paths 340 and 342. Further, heat flows from cooling plate 330 to heatframe 302 through mounting component 308 along a heat transfer path 344. Accordingly, cooling structure 300 facilitates removing heat generated on first plane layer 322 and/or second plane layer 326 while maintaining electrical isolation between cooling plate 330 and first and second plane layers 322 and 326.

Figure 5:
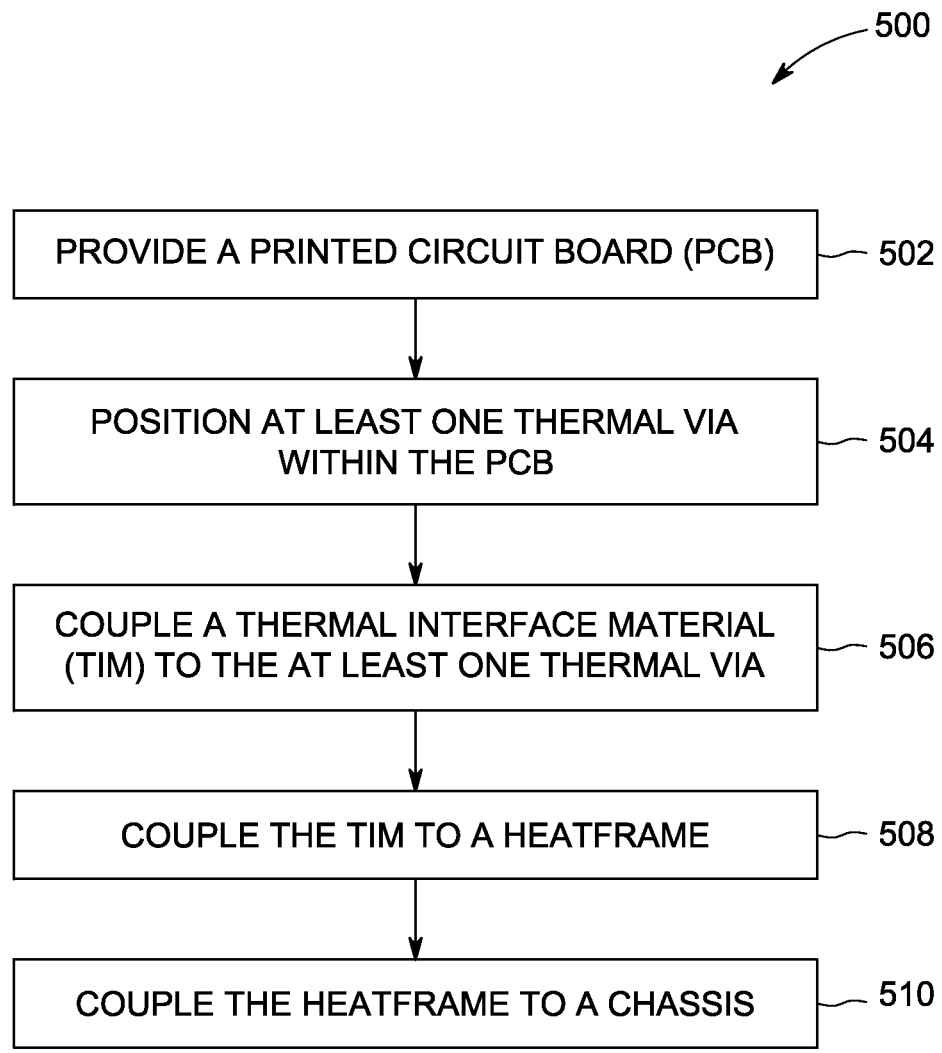
FIG. 5 is a flow chart of an exemplary method of assembling a printed circuit board assembly that may be used to assemble the printed circuit board assembly shown in FIG. 2.

FIG. 5 is a flow chart of an exemplary method 500 for assembling a PCB assembly, such as PCB assembly 100. Method 500 includes providing 502 a PCB, such as PCB 106. At least one thermal via is positioned 504 within the PCB, such as thermal via 222. To facilitate removing heat from the PCB, a TIM, such as TIM 122, is coupled 506 to the at least one thermal via. The TIM is also coupled 508 to a heatframe, such as heatframe 104. The heatframe is coupled 510 to a chassis, such as chassis 102. The chassis is kept at a temperature lower than the temperature of the PCB, such that when heat is generated on the PCB, the generated heat flows through the thermal via, through the TIM, and through the heatframe to the chassis. This facilitates cooling the PCB and any electrical and/or circuit components stored thereon.

The systems and methods described herein facilitate removing heat generated on a printed circuit board (PCB). A thermal interface material (TIM) composed of a thermally conductive and electrically insulated material couples a heatframe to the PCB. The PCB includes at least one thermal coupled to the TIM. Heat generated on the PCB is removed through the thermal via, the TIM, and the heatframe. Since the TIM is electrically insulated, circuit ground planes on the PCB may be tied directly to the thermal via, improving the quantity and/or rate of heat removed from the PCB. Finally, because thermal vias may be tied directly to circuit ground planes, the systems described herein have a lower thermal resistivity as compared to known PCB assemblies, and accordingly, increased heat transfer properties.

Exemplary embodiments of a system for removing heat from a PCB are described above in detail. The methods and systems are not limited to the specific embodiments described herein, but rather, components of systems and/or steps of the methods may be utilized independently and separately from other components and/or steps described herein. The methods and systems may also be used in combination with other devices and are not limited to practice with only the systems and methods as described herein. For example, the TIM and thermal vias described herein may be used to transfer heat between a power supply unit and a base plate, a chassis and cooling fins, a chassis and a base plate, and the like. Accordingly, the exemplary embodiment can be implemented and utilized in connection with many other applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A printed circuit board assembly comprising
    a chassis defining a slot through a wall thereof;
    a heatframe disposed in said slot, said heatframe being engaged with and coupled to said chassis for heat exchange therebetween;
    an expandable fastener disposed in said slot between said chassis and said heatframe for coupling said heatframe to said chassis;
    a printed circuit board (PCB) mounted to said heatframe;
    a thermal interface material (TIM) coupled between said PCB and said heatframe, said TIM being thermally conductive and electrically insulated; and
    at least one thermal via extending through said PCB and coupled to said TIM, said thermal via for transferring heat from said PCB to said chassis through said TIM and said heatframe.

2. An assembly in accordance with claim 1, wherein said at least one thermal via is composed of a thermally conductive and electrically conductive material.

3. An assembly in accordance with claim 1, wherein said PCB comprises a plurality of circuit planes, and wherein said at least one thermal via is tied to at least one of said plurality of circuit planes.

4. An assembly in accordance with claim 3, wherein said at least one thermal via is tied to at least one circuit ground plane of said plurality of circuit planes.

5. An assembly in accordance with claim 3, wherein said at least one thermal via is tied to at least one circuit power plane of said plurality of circuit planes.

6. An assembly in accordance with claim 1, wherein said PCB comprises at least one route layer and at least one plane layer, said assembly further comprising:
    a mounting component coupled to said heatframe and extending through an aperture defined through said PCB;
    a cooling plate coupled to said mounting component and oriented substantially co-planar with said at least one route layer, wherein said cooling plate overlaps at least a portion of said at least one plane layer to facilitate removing heat from said at least one plane layer.

7. A method of assembling a printed circuit board assembly, said method comprising:
proving a printed circuit board (PCB);
positioning at least one thermal via within the PCB;
coupling a thermal interface material (TIM) composed of a thermally conductive and electrically insulated material, to the at least one thermal via;
coupling the TIM to a heatframe;
coupling the PCB to the heatframe; and
coupling the heatframe to a chassis using an expandable fastener such that heat is transferred from the PCB to the chassis through the at least one thermal via, the TIM, and the heatframe.

8. A method in accordance with claim 7, wherein providing a PCB comprises providing a PCB having a plurality of circuit planes, said method further comprises tying at least one of the plurality of circuit planes to the at least one thermal via.

9. A method in accordance with claim 8, wherein tying at least one circuit plane to the at least one thermal via comprises tying a circuit ground plane to the at least one thermal via.

10. A method in accordance with claim 8, wherein tying at least one circuit plane to the at least one thermal via comprises tying a circuit power plane to the at least one thermal via.

* * * * *